(12) United States Patent
Jeon et al.

(10) Patent No.: US 7,477,536 B2
(45) Date of Patent: Jan. 13, 2009

(54) FERROELECTRIC RANDOM ACCESS MEMORY DEVICE AND METHOD OF DRIVING THE SAME

(75) Inventors: Byung-Gil Jeon, Suwon-si (KR);
Kang-Woon Lee, Seoul (KR);
Byung-Jun Min, Suwon-si (KR);
Han-Joo Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/602,280

(22) Filed: Nov. 21, 2006

(65) Prior Publication Data

US 2007/0121367 A1    May 31, 2007

(30) Foreign Application Priority Data

Nov. 23, 2005    (KR) .................... 10-2005-0112453

(51) Int. Cl.
*G11C 11/34* (2006.01)

(52) U.S. Cl. ........................ 365/145; 365/205

(58) Field of Classification Search ............. 365/145, 365/205

See application file for complete search history.

(56) References Cited

U.S. PATENT DOCUMENTS 6,356,475 B1 *  3/2002  Tamura et al. .............. 365/145

6,487,128 B2 * 11/2002  Bohm et al. ............ 365/189.07
6,906,975 B2 *  6/2005  Kang et al. ................ 365/211

FOREIGN PATENT DOCUMENTS

| JP | 08-321190 | 12/1996 |
| JP | 2001-084799 | 3/2001 |
| KR | 100184449 B1 | 12/1998 |
| KR | 1020010004110 A | 1/2001 |

* cited by examiner

*Primary Examiner*—Michael T Tran
(74) *Attorney, Agent, or Firm*—Volentine & Whitt, PLLC

(57) ABSTRACT

A ferroelectric random access memory (FRAM) device includes a memory cell array including a plurality of FRAM cells connected to a first bit line and a reference cell connected to a second bit line. The device also includes a sense amplifier circuit configured to evaluate an amount of charges induced in a FRAM cell at a first mode and sense data stored in the FRAM cell at a second mode, wherein the sense amplifier circuit comprises a reference voltage generator configured to output an externally applied voltage as a reference voltage at the first mode, and output the reference voltage in response to a voltage applied to the second bit line from the reference cell and a voltage charged to an offset node at the second mode, and an amplifier circuit configured to sense and amplify a difference between a voltage applied to the first bit line from a selected FRAM cell and the reference voltage.

14 Claims, 6 Drawing Sheets

FERROELECTRIC RANDOM ACCESS MEMORY DEVICE AND METHOD OF DRIVING THE SAME

BACKGROUND OF THE INVENTION

1. Field of the Invention

The present invention relates generally to a nonvolatile memory device and, more particularly, to a ferroelectric random access memory (FRAM) using ferroelectric capacitance memory cells and methods of driving the same.

A claim of priority is made to Korean Patent Application No. 2005-112453 filed on Nov. 23, 2005, the subject matter of which is incorporated by reference in its entirety.

2. Description of Related Art

Semiconductor memory devices are generally categorized into volatile semiconductor memory devices and nonvolatile semiconductor memory devices. The volatile semiconductor memory devices are divided into dynamic random access memories and static random access memories. While the volatile semiconductor memory devices have fast read and write operation rates, they loose stored data when an external power supply is cut off. On the other hand, the nonvolatile semiconductor memory devices can maintain stored data even when an external power supply is cut off. Therefore, the nonvolatile semiconductor memory devices are used in applications where there is a requirement for storing data in the absence of an external power supply.

Non-volatile memory devices may come in a variety of forms. These may include, for example, ferroelectric random access memories (FRAMs) and flash memories. Both FRAMs and flash memories are capable of executing high-rate data operations. However, the FRAMs have certain features that may make them more suitable for some applications. These features include, for example, low power dissipation and good impact endurance. The above-mentioned features may make, FRAMs usable as a main memory for various portable electronic devices.

FIG. 1 is a circuit diagram showing a conventional FRAM cell MC. Referring to FIG. 1, the FRAM cell MC includes one switch transistor Tr and one ferroelectric capacitor Cf. In cell MC, one terminal of the switch transistor Tr is connected to a bit line BL and another terminal is connected to one electrode of the ferroelectric capacitor Cf. Furthermore, the switch transistor Tr is gated to a word line MWL. The other electrode of the ferroelectric capacitor Tr is connected to a plate line MPL.

The FRAM cell MC stores logic states based on an electric polarization of the ferroelectric capacitor Cf. Specifically, a ferroelectric layer like a PZT (lead zirconate titanate) layer is formed between both electrodes of the ferroelectric capacitor Cf. Furthermore, when a voltage is applied to the electrodes (or plates) of the ferroelectric capacitor Cf, the ferroelectric layer is polarized along a direction of an electric field. At this time, a switching threshold for changing the polarization state of the ferroelectric capacitor Cf is called "a coercive voltage". In addition, the ferroelectric capacitor Cf is characterized by a hysteresis phenomenon. Moreover, a current corresponding to the polarization flows through the capacitor Cf.

When the voltage applied to the ferroelectric capacitor Cf is higher than the coercive voltage, the polarization state of the ferroelectric capacitor Cf changes according to a polarity of the applied voltage. In addition, the polarization state of the ferroelectric capacitor Cf is maintained as it is after the applied voltage is interrupted. This maintenance of the polarization state of the capacitor Cf despite the absence of the applied voltage allows for the FRAM to be used as a nonvolatile memory device.

Furthermore, the ferroelectric capacitor Cf has a high capacitance because of its high permittivity. In addition, ferroelectric capacitors are typically connected to one plate line MPL (as shown in FIG. 1). Therefore, because of the high capacitance of the capacitor Cf, a pulse signal applied to the plate line MPL is delayed for a long time (or has a long raising time). This delay of the pulse signal may degrade an operation rate of FRAM devices. There is therefore a need for methods for improving the operation rates of the FRAM devices.

Data stored in the FRAM cell MC is read out as follows. First, a voltage is applied to both electrodes of the ferroelectric capacitor Cf of the FRAM cell MC. Then, the bit line BL connected to the memory MC is sensed to find a variation in the amount of electrons induced thereto. A reference voltage generator is required to sense the variation in the amount of electrons arising in the bit line BL (i.e., a voltage variation of the bit line BL). This reference voltage generator generates a reference voltage Vref whose intermediate level corresponds to data "1" and whose lower level corresponds to data "0". Generally, the reference voltage Vref is generated by a reference cell having a ferroelectric capacitor Cf. In particular, the reference cell has the same characteristics as the FRAM cell MC.

A polarization of the ferroelectric capacitor in the memory cell MC is difficult to sense because an electrical field/polarization characteristic loop (i.e., a hysteresis loop) changes with time. Specifically, the hysteresis loop fades as time elapses. This is because of the non-reversibility occurring in a part of the ferroelectric layer in an electric field/polarization circulation. Furthermore, a voltage of the bit line BL connected to the ferroelectric memory cell MC also changes with time. The variation of the bit line voltage depending on time is described hereinafter.

FIG. 2 illustrates a variation in the amount of the induced bit line voltages with respect to time for each data state. Referring to FIG. 2, an increase ratio of a bit line voltage corresponding to data "1" (D1) is different from a decrease ratio of a bit line voltage corresponding to data "0" (D0). Therefore, when a predetermined time t1 elapses, sense margins MD 1 and MD0 increase respectively according to different ratios. Specifically, the sense margin MD1 is a difference between the bit line voltage D1 corresponding to data "1" and the reference voltage Vref. Similarly, the sense margin MD0 is a difference between the bit line voltage D0 corresponding to data "0" and the reference voltage Vref. Therefore, after the predetermined time t1, the reference voltage Vref may not have the same value as the intermediate bit line voltage D1 corresponding to the data "1" and the bit line voltage D0 corresponding to the data "0". This difference between the reference voltage Vref and the bit line voltages D1 and D0 may degrade the reliability of the FRAM. Thus, there exist problems pertaining to the reliability and stability of FRAM.

The present disclosure is directed towards overcoming one or more problems associated with the prior art FRAM devices.

SUMMARY OF THE INVENTION

One aspect of the present disclosure includes a ferroelectric random access memory (FRAM) device. The device includes a memory cell array including a plurality of FRAM cells connected to a first bit line and a reference cell connected to a second bit line. The device also includes a sense amplifier circuit configured to evaluate an amount of charges induced in a FRAM cell at a first mode and sense data stored in the FRAM cell at a second mode, wherein the sense amplifier circuit comprises a reference voltage generator configured to output an externally applied voltage as a reference voltage at the first mode, and output the reference voltage in response to a voltage applied to the second bit line from the reference cell and a voltage charged to an offset node at the second mode, and an amplifier circuit configured to sense and amplify a difference between a voltage applied to the first bit line from a selected FRAM cell and the reference voltage.

Yet another aspect of the present disclosure includes a method for evaluating an amount of charges induced in a FRAM cell at a first mode and sensing data stored in the FRAM cell at a second mode. The method includes initializing a first bit line connected to a plurality of FRAM cells and a second bit line connected to a reference cell to a ground level. The method also includes generating a reference voltage at the first mode by using an externally applied voltage. The method also includes generating the reference voltage at the second mode in response to a voltage applied from the reference cell to the second bit line and a voltage charged to an offset node. The method also includes sensing and amplifying a difference between a voltage applied from a selected FRAM cell to the first bit line and the reference voltage.

BRIEF DESCRIPTION OF THE DRAWINGS

The accompanying drawings are included to provide a further understanding of the disclosure, and are incorporated in and constitute a part of this specification. The drawings illustrate exemplary embodiments of the present disclosure and, together with the description, serve to explain principles of the present disclosure. In the drawings.

DETAILED DESCRIPTION OF PREFERRED EMBODIMENTS

Exemplary embodiments of the present disclosure will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

In an exemplary embodiment, a ferroelectric random access memory (FRAM) device includes a memory cell array including a plurality of FRAM cells. The plurality of FRAM cells are connected to a first bit line. In addition, the FRAM device includes a reference cell connected to a second bit line. The FRAM device also includes a sense amplifier circuit. The sense amplifier circuit may be configured to perform various functions. In particular, the sense amplifier circuit determines an amount of charges induced to the FRAM cell in a first mode and senses data stored in the FRAM cell in a second mode. Moreover, the sense amplifier circuit outputs an external applied voltage as the reference voltage in the first mode. Specifically, the sense amplifier circuit generates the reference voltage in response to a second bit line voltage provided by the reference cell and a voltage charged to an offset node in a second mode. The components of the FRAM device are described in detail herein.

Figure 1:
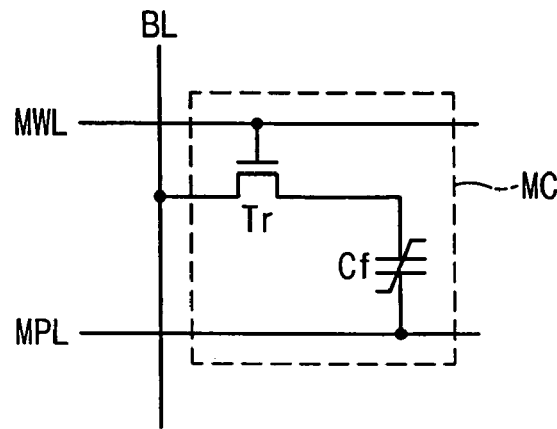
FIG. 1 is a circuit diagram of a conventional FRAM cell.
Figure 2:
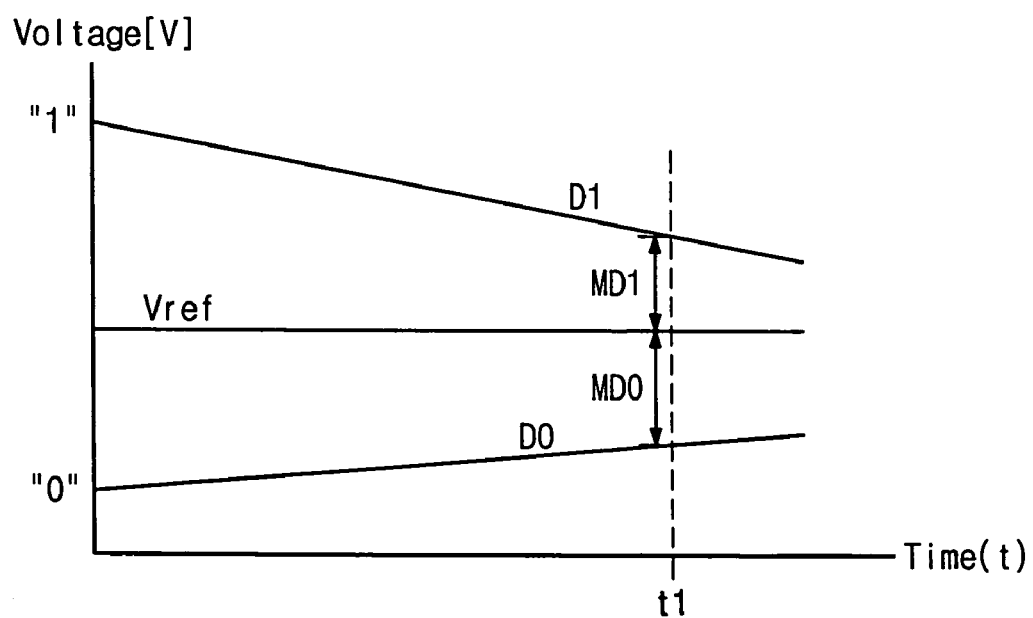
FIG. 2 is graph illustrating a variation in the amount of voltage induced to a bit line of a FRAM device per unit time in each data state.
Figure 3:
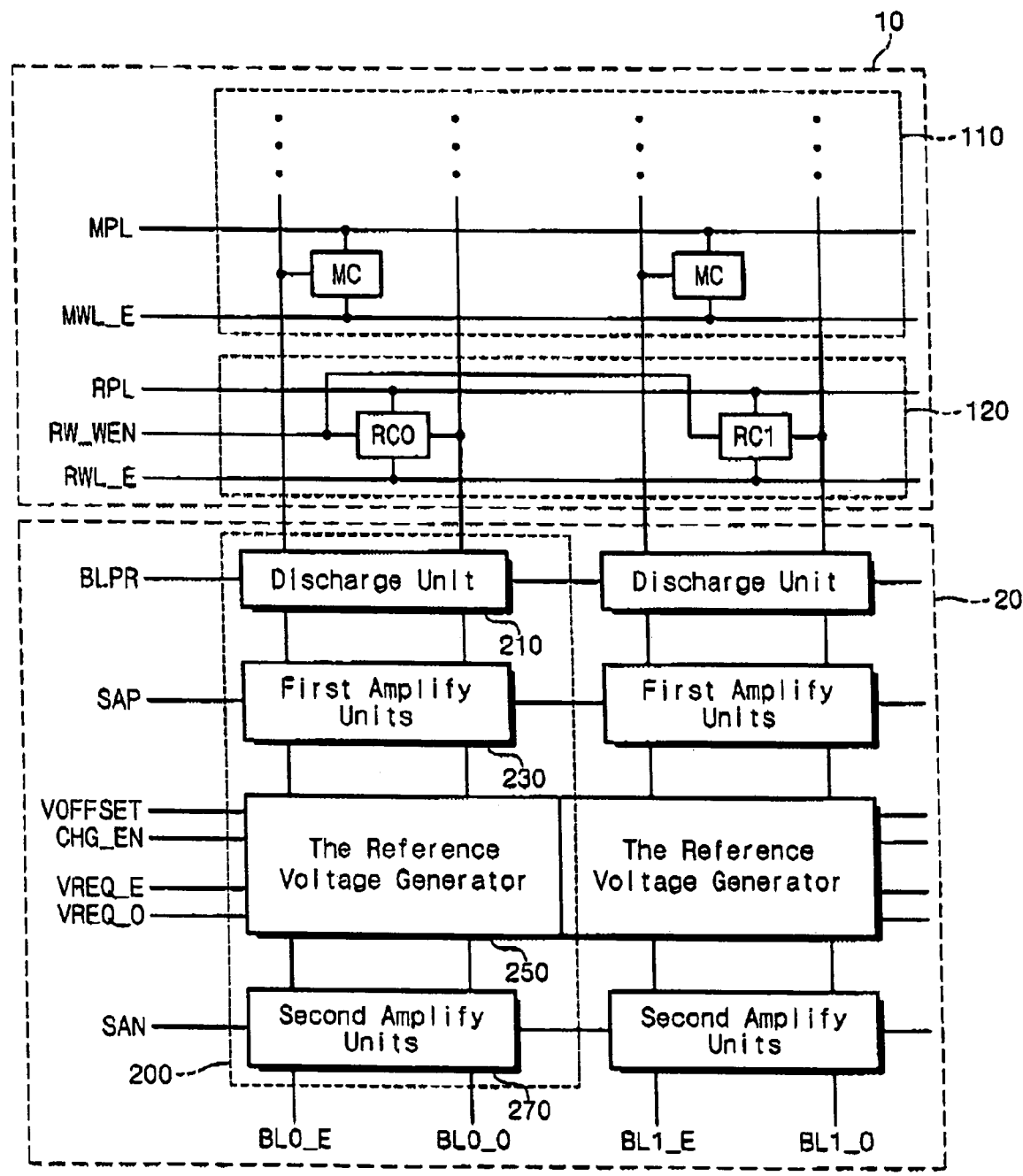
FIG. 3 is a schematic block diagram of a FRAM device in accordance with an exemplary disclosed embodiment.
Figure 4:
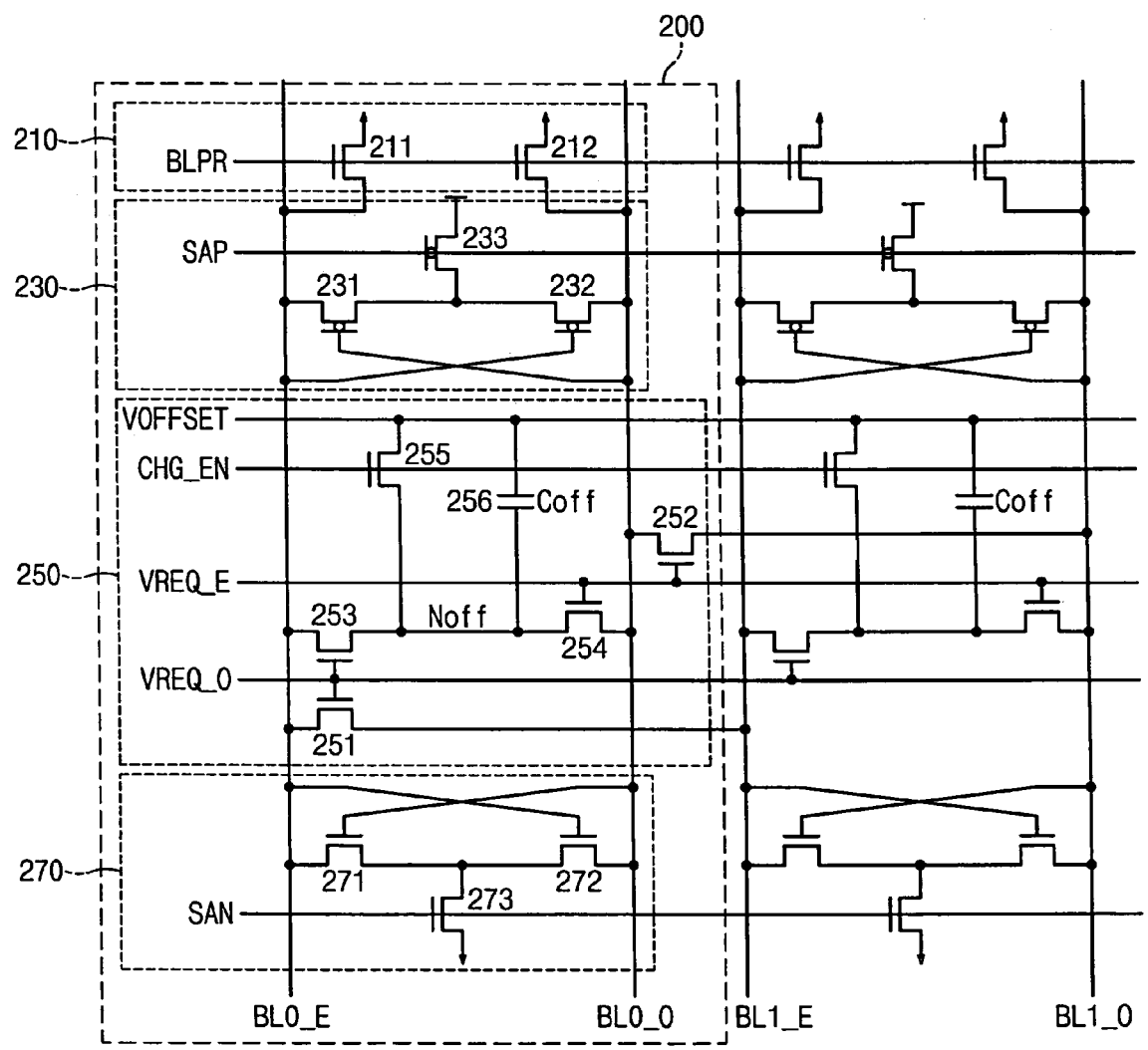
FIG. 4 is a detailed circuit diagram of a sense amplifier circuit in FIG. 3.

FIG. 3 is a schematic block diagram of a FRAM device in accordance with an exemplary disclosed embodiment and FIG. 4 is a detailed circuit diagram of a sense amplifier circuit 200 in FIG. 3. Referring to FIG. 3, the FRAM device includes a memory cell array 10 and a sense amplifier 20. The memory cell array 10 includes a main cell array 110 and a reference cell array 120. Specifically, the main cell array 110 is comprised of a plurality of FRAM cells MC. In addition, the reference cell array 120 is comprised of reference cells RC0, and RC1 having structures similar to the FRAM cells MC.

In the main cell array 110, each of the rows connected to the FRAM cells may comprise one word line and one plate line or one plate line sharing two word lines. Similarly, each of the rows connected to reference cells RC0 and RC1 of the reference cell array 120 has structures similar to each row of the main cell array 110. As shown in FIG. 3, the main and reference cell arrays 110 and 120 have one plate line sharing two word lines. Furthermore, each of the rows connects to a couple of bit lines BLi_E and BLi_O.

The ferroelectric memory cell MC includes a switch transistor Tr and a ferroelectric capacitor Cf. Furthermore, one terminal of the switch transistor Tr is connected to one of the bit lines BLi_E and BLi_O and the other terminal is connected to one electrode of the FRAM capacitor Cf. In addition, the switch transistor Tr is gated to a main word line MWL_E or MWL_O. Moreover, the other electrode of the FRAM capacitor Cf is connected to a main plate line MPL. The reference cells RC0 and RC1 have basically the same structure as the FRAM cell MC. However, the reference cell RC0 stores fixed data corresponding to data "0", and the reference cell RC1 stores fixed data corresponding to data "1".

The sense amplifier circuit 200 of FIG. 4 is connected between a couple of bit lines BLi_E and BLi_O. Specifically, the bit line BLi_E is provided with a voltage corresponding to a polarization state of the FRAM cell MC. In addition, the bit line BLi_O is provided with a voltage corresponding to a reference voltage Vref. The sense amplifier circuit 200 senses and amplifies a difference of the voltages provided to the corresponding bit lines BLi_E and BLi_O. In addition, the reference voltage Vref is generated from a reference voltage generator 250 in the sense amplifier circuit 200. Additionally, the sense amplifier circuit 200 determines the amount of charges induced to the FRAM cell MC based on an applied voltage level. This determination of the amount of charges induced to the FRAM cell MC may be used in testing a chip performance in a manufacturing process of the FRAM device.

As shown in FIG. 3, an identical sense amplifier circuit 200 is connected between every couple of bit lines BLi_E and BLi_O. Thus, for convenience of explanation, operations of one sense amplifier circuit 200 and the FRAM cell MC connected to the circuit 200 will be described hereinafter. Referring to FIG. 4, the sense amplifier circuit 200 will now be fully described.

Referring to FIG. 4, the sense amplifier circuit 200 includes a discharge unit 210, a first amplifier unit 230, a reference voltage generator 250 and a second amplifier unit 270. The discharge unit 230 includes two transistors 211 and 212 designed to discharge the bit lines BLi_E and BLi_O to a ground voltage in response to a control signal BLPR. The transistor 211 has a source terminal connected to the bit line BL0_E, a drain terminal connected to a ground voltage and a gate terminal receiving the control signal BLPR. The transistor 212 has a source terminal connected to the bit line BL0_O, a drain terminal connected to a ground voltage and a gate terminal receiving the control signal BLPR. The transistors 211 and 212 discharge all bit lines to a ground voltage level in response the activated control signal BLPR before the sense amplifier circuit 200 starts an operation. As a result, abnormal charges that may exist in the bit lines are removed. In addition to the bit lines, an internal node connected to the bit lines (e.g., an offset node Noff) is also discharged.

The first amplifier unit 230 includes p-type MOS transistors (i.e., PMOS transistors) 231, 232 and 233. Specifically, drain terminals of the PMOS transistors 231 and 232 are cross coupled to gate terminals thereof, respectively. The PMOS transistor 233 applies a source voltage to the PMOS transistors 231 and 232. The PMOS transistor 231 includes a source terminal connected to a drain of the PMOS transistor 233, a drain terminal connected to the bit line BL0_E, and a gate terminal connected to the bit line BL0_O. The PMOS transistor 232 includes a source terminal connected to the drain of the PMOS transistor 233, a drain terminal connected to the bit line BL0_O, and a gate terminal connected to the bit line BL0_E. The cross coupled source terminals of the PMOS transistors 231 and 232 are both connected to of the drain terminal of the PMOS transistor 233 in common. The PMOS transistor 233 includes a source terminal connected to a power supply voltage, the drain terminal connected to the transistors 231 and 232 in common, and a gate terminal receiving a control signal SAP.

The second amplifier unit 270 includes n-type MOS transistors (i.e., NMOS transistors) 271, 272 and 273. Drain terminals of the NMOS transistors 271 and 272 are cross coupled to gate terminals thereof, respectively. The NMOS transistor 273 provides a source voltage to the PMOS transistors 271 and 272. To this end, the NMOS transistor 271 includes a source terminal connected to a drain of the NMOS transistor 273, a drain terminal connected to the bit line BL0_E, and a gate terminal connected to the bit line BL0_O. Similarly, the NMOS transistor 272 includes a source terminal connected to the drain of the NMOS transistor 273, a drain terminal connected to the bit line BL0_O, and a gate terminal connected to the bit line BL0_E. In addition, the cross coupled source terminals of the NMOS transistors 271 and 272 are connected to the drain terminal of the NMOS transistor 273 in common. The NMOS transistor 273 includes a source terminal connected to a ground voltage, the drain terminal connected to the transistors 271 and 272 in common, and a gate terminal receiving a control signal SAN.

The control signals SAP and SAN are used for controlling operations of the first and second amplifier units 230 and 270. The first and second amplifier units 230 and 270 amplify a higher voltage (or current) of the two bit lines BL0_E and BL0_O. That is, the first and second amplifier units 230 and 270 compare the voltage applied to the bit line BL0_E from the FRAM cell MC with the reference voltage Vref applied to the bit line BL0_O, and then sense data stored in the FRAM cell MC based on the result of the comparison. Such differential sense amplifier circuits are disclosed in U.S. Pat. No. 4,873,664 by Eaton Jr., entitled "SELF RESTORING FERROELECTRIC MEMORY".

The reference voltage generator 250 includes two smoothing transistors 251 and 252, three switch transistors 253, 254, and 255, and one offset capacitor 256. The smoothing transistor 251 has a current path connected to neighboring bit lines BL0_E and BL1_E and a gate receiving a control signal VREQ_O. The smoothing transistor 252 has a current path connected to neighboring bit lines BL0_O and BL1_O and a gate receiving a control signal VREQ_E. The switch transistor 253 is gated to the gate of the smoothing transistor 251 and receives a control signal VREQ_O. Current paths of the transistors 253 and 254 are connected between the bit lines BL0_E and BL0_O in series. In addition, a source terminal of the transistor 253 is connected to a bit line BLO_E and a drain terminal is connected to a source terminal of the transistor 254. Moreover, a source terminal of the transistor 254 is connected the drain terminal of the transistor 253 via an offset node Noff, and a drain terminal is connected to the bit line BL0_O.

The offset node Noff is where the drain terminal of the transistor 253 and the source terminal of the transistor 254 are connected. The offset node Noff is used in outputting an offset voltage to the bit line which will be described later. A control gate of the transistor 254 is connected to a control gate of the smoothing transistor 252 to receive the control signal VREQ_E.

One terminal of the transistor 255 and one terminal of the offset capacitor 256 are connected to the offset node Noff in common. Furthermore, the other terminals of the transistor 255 and the offset capacitor 256 are connected to an input terminal of an externally provided offset voltage VOFFSET in common. In addition, the transistor 255 is gated to a control signal CHG_EN to switch charge/discharge operations of the offset capacitor 256. Furthermore, outputs of the charged or discharged offset capacitor 256 are provided to the offset node Noff. Moreover, the voltage of the offset node Noff is provided to a corresponding bit line BL0_O by switching operations of the transistors 253 and 254.

The reference voltage generator 250 executes roughly two operations. One is to generate a reference voltage Vref used in a normal read operation. The other is to generate a reference voltage Vref used to determine an amount of charges in the FRAM cell MC in a test mode. The reference voltage generated in the normal operation mode is determined by capacitances Cns and Cs of FRAM cells in the reference cells RC0 and RC1 and a capacitance Coff of the offset capacitor 256. However, the reference voltage generated in the test mode is determined by the external offset voltage VOFFSET. Furthermore, the reference voltage Vref generated in the normal operation mode has a level that may be changed by controlling the capacitance Coff of the offset capacitor 256. For example, the reference voltage generated by the reference voltage generator 250 in a normal mode is calculated by the following equation:

$$Vref = \frac{(Cs + Cns) \times V_{RPL}}{Cs + Cns + C_{off} + 2 \times C_{BL}} \quad (1)$$

The variable "Cs" is a capacitance of the reference cell RC1 storing data "1", and the variable "Cns" is a capacitance of the reference cell RC0 storing data "0". Furthermore, the variable "Coff" indicates a capacitance of the offset capacitor 256, "CBL" means a capacitance of the bit line and "VRPL" indicates a voltage applied to a reference plate line.

As indicated by equation (1), the reference voltage Vref is inversely proportional to the capacitance Coff of the offset capacitor 256. Thus, if the offset capacitor is not included, the reference voltage Vref has an intermediate value of voltages corresponding to the data "1" and "0". In this case, sense margins of the data "1" and "0" are different from each other as time elapses. However, when the offset capacitor is included as in the present invention, the reference voltage Vref has a value lower than the intermediate value of the voltages corresponding to the data "1" and "0" because of the capacitance Coff of the offset capacitor. As a result, the sense margins of the data "1" and "0" can be changed in a similar ratio. Furthermore, the offset capacitor can decrease a time required for generating the reference voltage Vref.

Figure 5:
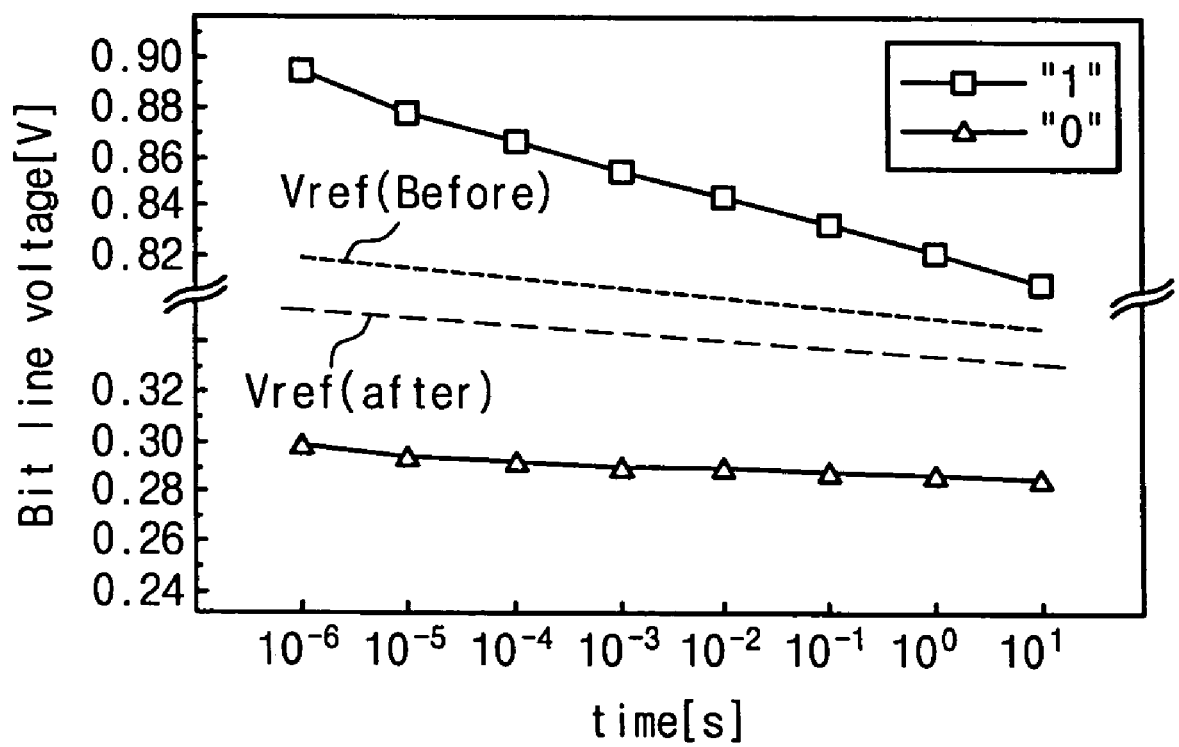
FIG. 5 is a graph illustrating a variation in the amount of a voltage induced in the bit line according to a data state stored in a FRAM cell, and a reference voltage variation used in sensing the data, both with respect to time.

FIG. 5 is a graph showing a variation of a voltage induced in the bit line BLP_E according to a state of data stored in a FRAM cell, and a reference voltage variation used in sensing the data, both with respect to time. Referring to FIG. 5, a decrease ratio of a bit line voltage D1 corresponding to data "1" is different from an increase ratio of a bit line voltage D0 corresponding to data "0". This difference between the decrease and increase ratios is due to a physical characteristic of the FRAM cell MC. Now, if a reference voltage is fixed to have an intermediate value corresponding to data "0" and the voltage corresponding to data "1", the sense margins of the data "1" and "0" are sufficient in the initial state. However, the sense margin of the data "1" gradually decreases as time elapses. To prevent this problem, in an exemplary embodiment, a reference voltage generator 250 uses the offset capacitor Coff to output a reference voltage Vref whose voltage level is lower than the previous intermediate value. As a result, a sufficient sense margin of data "1" can be ensured as time passes.

Meanwhile, in a test mode, the reference voltage generator 250 outputs a reference voltage Vref using an external offset voltage VOFFSET instead of reference cells RC0 and RC1. Furthermore, the reference voltage Vref generated in the test mode is altered based on a variation of the external offset voltage VOFFSET. The altered reference voltage Vref is applied to the bit line BL0_O to sense data stored in the FRAM cell MC. Furthermore, an amount of charges induced in the FRAM cell MC is evaluated as a result of sensing the data stored in the FRAM cell MC with the changing reference voltage Vref. The evaluated charge amount may become a ground of researching operation characteristics and defects of the FRAM cell MC. The operations of the reference voltage generator 250 at each operation mode will now be described with reference to FIGS. 6 and 7.

Figure 6:
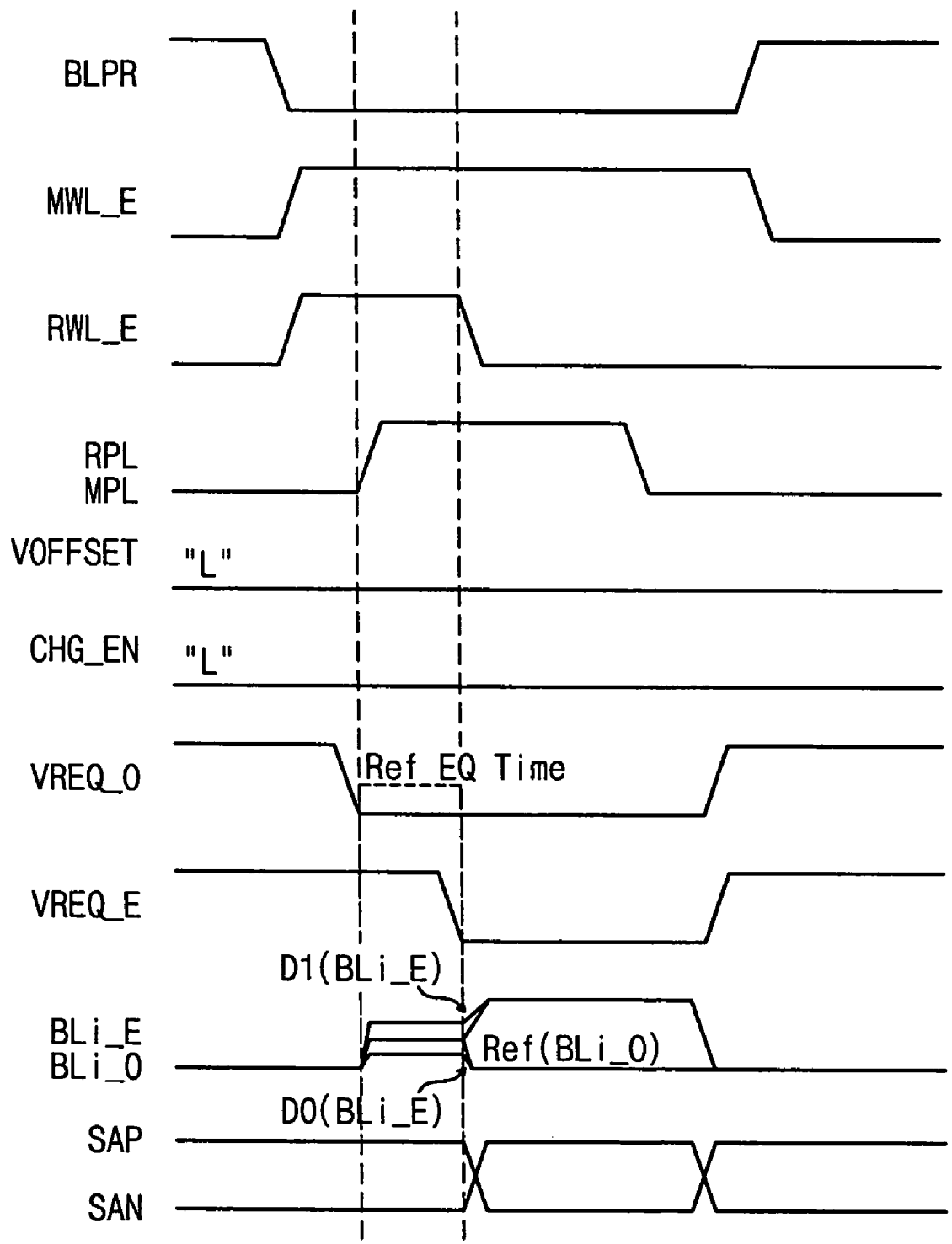
FIG. 6 is a timing diagram showing a normal read operation of a sense amplifier circuit in accordance with an exemplary disclosed embodiment.

FIG. 6 is a timing diagram showing a normal read operation of a sense amplifier circuit in accordance with an exemplary disclosed embodiment. Referring to FIGS. 4 and 6, a control signal BLPR is activated to a high level before a read operation. Furthermore, a discharge unit 210 discharges the bit lines BL0_E, BL0_O, BL1_E and BL1_O and an offset node Noff to a ground level in response to the activated control signal BLPR. This discharging of the bit lines BL0_E, BL0_O, BL1_E and BL1_O and the offset node Noff may ensure that abnormal charges are removed from them. In an exemplary embodiment, an external offset voltage VOFFSET is not applied to the reference voltage generator and the charge evaluate operation is not executed on the FRAM cell MC. Accordingly, the offset voltage VOFFSET and the control signal CHG_EN are in a low level, such that the transistor 255 is continuously turned off.

Next, a specific main word line MWL_E and a reference word line RWL_E are activated according to externally applied addresses. At this time, internal switch transistors Tr in FRAM cells MC and reference cells RC1 and RC0 connected to the activated word line are turned on. Furthermore, when the control signal BLPR is deactivated from the high level to a low level, the bit lines BL0_E, BL0_O, BL1_E, and BL1_O are floated. Then, a control signal VREQ_0 is deactivated from a high level to a low level and a main plate line MPL and a reference plate line RPL are activated. During this time, a control signal VREQ_E is continuously in a high level. As a result, transistors 251 and 253 coupled to the bit line BL0_E which is connected to the main memory cell MC are turned off. In addition, transistors 252 and 254 coupled to the bit lines BL0_0 and BL1_0 which are connected to the reference cells RC0 and RC1 are turned on.

When the main plate line MPL and a reference plate line RPL are activated, voltages from the reference cells RC1 and RC0 are smoothened and the offset capacitor 256 is charged. In particular, the offset capacitor 256 is charged to a specific level by the turned-on transistor 254 connected to the bit line BL0_O. Furthermore, a capacitance Coff of the charged offset capacitor 256 is used in determining a level of the reference voltage Vref as presented in equation (1).

After a predetermined time goes by, when the control signal VREQ_E is inactivated from a high level to a low level, the smoothing of the bit line voltage ends. Then, a sense operation is executed on a selected main cell MC in response to control signal SAP and SAN. In a sense operation, first and second amplifier units 230 and 270 sense and amplify a higher voltage (or current) of the two bit lines BL0_E and BL0_O. For example, if data "1" is stored in a ferroelectric capacitor Cf, the voltage of the bit line BL0_E is higher than that of the bit line BL0_O. On the other hand, if data "0" is stored in a ferroelectric capacitor Cf, the voltage of the bit line BL0_E is lower than that of the bit line BL0_O.

Figure 7:
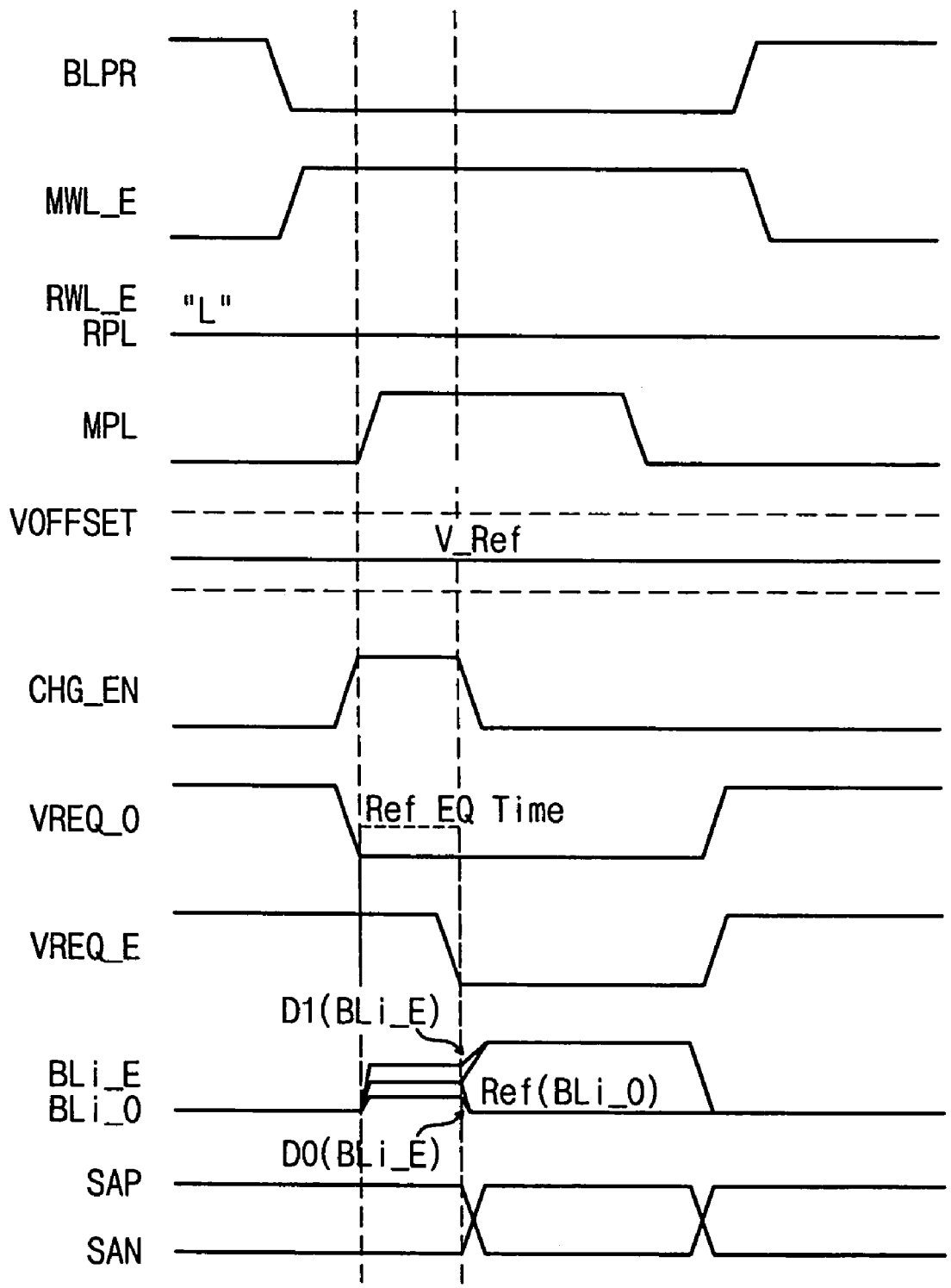
FIG. 7 is a timing diagram showing a charge evaluate operation of the sense amplifier circuit in accordance with an exemplary disclosed embodiment.

FIG. 7 is a timing diagram showing a charge evaluate operation of the sense amplifier circuit in accordance with an exemplary disclosed embodiment. Typically, the charge evaluate operation of the sense amplifier circuit 200 is executed by a manufacturer in a test mode.

Referring to FIG. 4 and 7, before the charge evaluate operation, a control signal BLPR is activated to a high level. Furthermore, the discharge unit 210 discharges bit lines BL0_E, BL0_O, BL1_E, and BL1_O and an offset node Noff to a ground level in response to the activated control signal BLPR. This discharging may remove abnormal charges from the bit lines BL0_E, BL0_O, BL1_E, and BL1_O and the offset node Noff. At this time, a main word line MWL_E to be tested is activated base on externally applied addresses. Furthermore, the switch transistors Tr in FRAM cells MC that are to be connected to the activated word line are also turned on.

Then, the control signal BLPR is deactivated from a high to low level. This deactivation of the control signal BLPR floats the bit lines BL0_E, BL0_O, BL1_E, and BL1_O. In an exemplary embodiment, reference cells RC0 and RC1 generate a reference voltage Vref using an externally applied offset voltage VOFFSET. At this time, a reference word line RWL_E and a reference plate line RPL are not activated and therefore receive the external offset voltage VOFFSET of a predetermined level in the charge evaluate operation (i.e., in the charge evaluate interval). In addition, a control signal CHG_EN is initially deactivated to a low level. Therefore, the transistor 255 is turned off and the offset capacitor 256 is charged with the external offset voltage VOFFSET.

When the charge evaluate operation on the FRAM cell starts, the control signal CHG_EN is activated from a low level to a high level and a control signal VREQ_O is inactivated from high to low. In this case, a control signal VREQ_E maintains a high level continuously.

As the control signal CHG_EN is activated to high, the transistor 255 connected to the offset node Noff is turned on. When the transistor 255 is turned on, the offset voltage VOFFSET is provided to the offset node Noff. Furthermore, responding to the control signals VREQ_O and VREQ_E, transistors 251 and 253 are turned off and the transistors 252 and 254 are turned on. Thus, the offset voltage VOFFSET of the offset node Noff is sent to the bit line BL0_O by the turned-on transistor 254.

In this case, the transistor 252 smooths the offset voltage VOFFSET provided to each of the bit lines BL0_O and BL1_O. Furthermore, the smoothened voltages of the bit lines BL0_O and BL1_O are the same as the offset voltage VOFFSET. Consequentially, the voltage smoothened by the transistor 252 is identical to the offset voltage VOFFSET.

The above reference voltage generate operations are executed while the control signal VREQ_O is in a low level and the control signals CHG_EN and VREQ_E and the main plate line MPL are in a high level. After the reference voltage Vref is generated, when the control signals VREQ_E and CHG_EN are sequentially inactivated to a low level, the charge evaluated operation is substantially executed on the main cell MC. Specifically an amount of charge in an internal ferroelectric capacitor Cf of the main cell MC is determined in the charge evaluate operation. This determination is made by the first and second amplifier units 230 and 270, respectively. In particular, first and second amplifier units 230 and 270 compare amounts of the charges in the selected main cell MC with the reference voltage Vref (i.e., the offset voltage VOFFSET) in response to control signal SAP and SAN. As a result of this comparison, the charge amount of the main cell MC is evaluated.

The offset voltage VOFFSET may be used as the reference voltage Vref in the charge evaluate operation. Furthermore, this offset voltage may be changed to various levels between the ground voltage and a predetermined voltage. For example, the offset voltage VOFFSET may increase from the ground voltage or decrease from the predetermined voltage to the ground voltage gradually. The variation of the offset voltage VOFFESET is determined according to executed test operations and data written in the FRAM cell MC. Moreover, the amount of the charges induced to the FRAM cell MC may be determined accurately by the charge evaluation operation of the present disclosure.

As explained above, the FRAM device of the present disclosure can measure an amount of the charge induced to an FRAM cell to evaluate a characteristic of the FRAM cell. Therefore, a threshold distribution of the FRAM device may be improved and cell defects may be tested. Furthermore, a reference voltage required in a normal read operation may be generated by using a charge evaluation circuit, so as to ensure a stable sense margin without additional circuits. In addition, using the charge evaluation circuit to generate the reference voltage may also reduce the time needed for generating the reference voltage.

Although the present disclosure includes exemplary embodiments illustrated in the accompanying drawings, it is not limited thereto. It will be apparent to those skilled in the art that various substitution, modifications and changes may be thereto without departing from the scope and spirit of the invention.

What is claimed is:

1. A ferroelectric random access memory (FRAM) device, comprising:
   a memory cell array including a plurality of FRAM cells connected to a first bit line and a reference cell connected to a second bit line; and
   a sense amplifier circuit configured to evaluate an amount of charges induced in a FRAM cell at a first mode and sense data stored in the FRAM cell at a second mode,
   wherein the sense amplifier circuit comprises:
      a reference voltage generator configured to output an externally applied voltage as a reference voltage at the first mode, and output the reference voltage in response to a voltage applied to the second bit line from the reference cell and a voltage charged to an offset node at the second mode; and
      an amplifier circuit configured to sense and amplify a difference between a voltage applied to the first bit line from a selected FRAM cell and the reference voltage.

2. The device of claim 1, wherein the sense amplifier circuit further comprises a discharge unit configured to initialize the first and second bit lines to a ground level.

3. The device of claim 1, wherein the reference voltage is changed in the first mode.

4. The device of claim 1, wherein the reference voltage of the second mode is lower than an intermediate value of a voltage generated when data "1" is stored in the reference cell and a voltage generated when data "0" is stored in the reference cell.

5. The device of claim 1, wherein the reference voltage of the second mode is inversely proportional to a capacitance of the offset node.

6. The device of claim 1, wherein the reference voltage generator comprises:
   a first switch configured to select a voltage applied to an offset node from the first bit line, being connected between the first bit line and the offset node;
   a second switch configured to select a voltage applied to the offset node from the second bit line, being connected between the second bit line and the offset node;
   an offset charge circuit configured to charge the offset node with the voltage applied to the offset node;
   a third switch configured to provide the externally applied voltage of the first mode to the offset node directly; and
   a smooth circuit configured to smooth the voltage of the offset node and a voltage applied to two neighboring second bit lines to generate the reference voltage.

7. A method for evaluating an amount of charges induced in a FRAM cell at a first mode and sensing data stored in the FRAM cell at a second mode, comprising:
   initializing a first bit line connected to a plurality of FRAM cells and a second bit line connected to a reference cell to a ground level;
   generating a reference voltage at the first mode by using an externally applied voltage;
   generating the reference voltage at the second mode in response to a voltage applied from the reference cell to the second bit line and a voltage charged to an offset node; and
   sensing and amplifying a difference between a voltage applied from a selected FRAM cell to the first bit line and the reference voltage.

8. The method of claim 7, wherein the reference voltage is changed at the first mode.

9. The method of claim 7, wherein the reference voltage of the second mode is lower than an intermediate value of a voltage generated when data "1" is stored in the reference cell and a voltage generated when data "0" is stored in the reference cell.

10. The method of claim 7, wherein the reference voltage of the second mode is inversely proportional to a capacitance of the offset node.

11. The method of claim 7, wherein the generating of the reference voltage at the first mode, comprises:
   deactivating the reference cell and applying an offset voltage obtained from an external source to the reference cell;
   selecting a FRAM cell to be tested;
   preventing a voltage from the selected FRAM cell from being applied to the offset node by blocking the voltage applied from the selected FRAM cell to the first bit line;
   applying the offset voltage to the offset node directly; and
   outputting the voltage of the offset node to the second bit line as the reference voltage.

12. The method of claim 11, wherein the generating of the reference voltage of the first mode further comprises smoothening a voltage applied to the second bit line and a voltage applied to another second bit line neighboring the second bit line.

13. The method of claim 11, wherein the smoothed voltages are the same as the offset voltage.

14. The method of claim 7, wherein the generating of the reference voltage at the second mode, comprises:
   selecting a FRAM cell to be sensed and a reference cell corresponding to the FRAM cell;
   preventing a voltage from the selected FRAM cell from being applied to the offset node by blocking the voltage applied from the selected FRAM cell to the first bit line;
   charging the offset node with a voltage applied from the selected reference cell to the second bit line; and
   smoothing voltages of the offset node, the second bit line, and another second bit line neighboring the second bit line to generate the reference voltage.

* * * * *